United States Patent [19]
Pelc et al.

[11] Patent Number: 5,697,370
[45] Date of Patent: Dec. 16, 1997

[54] METHOD FOR INCREASING TEMPORAL RESOLUTION OF MR FLUOROSCOPY

[75] Inventors: Norbert J. Pelc, Los Altos, Calif.; Stephen G. Hushek, Brookfield, Wis.

[73] Assignees: General Electric Company, Waukesha, Wis.; Board of Trustees of the Leland Stanford Jr. University, Stanford, Calif.

[21] Appl. No.: 587,409

[22] Filed: Jan. 17, 1996

[51] Int. Cl.⁶ .................................................. A61B 5/055
[52] U.S. Cl. ............................... 128/653.2; 128/653.4
[58] Field of Search ............................ 128/653.3, 653.2, 128/653.4; 324/309

[56] References Cited

U.S. PATENT DOCUMENTS 4,739,766  4/1988  Riederer ........................ 128/653.3

*Primary Examiner*—Francis Jaworski
*Assistant Examiner*—Derrick Fields
*Attorney, Agent, or Firm*—Quarles & Brady

[57] ABSTRACT

A method is described for increasing the temporal resolution of MR fluoroscopy procedures. A central portion of the image requiring a higher temporal resolution is updated more frequently using less-than-complete newly acquired NMR data. A running average of the signals produced by peripheral structures is used to form the periphery of the image and to remove artifact-producing data from the less-than-complete NMR data.

11 Claims, 2 Drawing Sheets

METHOD FOR INCREASING TEMPORAL RESOLUTION OF MR FLUOROSCOPY

BACKGROUND OF THE INVENTION

The field of the invention is nuclear magnetic resonance imaging methods and systems. More particularly, the invention relates to MR fluoroscopy, the imaging of time varying processes that are not periodic.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques. Each measurement cycle requires a short time to execute, but to execute all the measurement cycles for an image can require considerable time.

MR fluoroscopy pertains to the imaging of time varying processes that are not periodic, such as the flow of a contrast agent through an organ or the monitoring of an interventional procedure. In these studies, the time required to acquire the data and produce an image is very important, since the primary objective is to observe the changes that are occurring in the subject. This time required to produce an updated image determines the "temporal resolution" of the system, and it should be as short as possible.

There are a number of methods used to increase the temporal resolution of an MRI scan. First, a measurement cycle with a short repetition time (TR) may be used, or a lower resolution image requiring fewer measurement cycles may be used. As described in U.S. Pat. No. 4,830,012, it is also possible to reconstruct a new image with less than all of the necessary measurement cycles by using the newly acquired data in combination with data acquired for the previous image to "partially" update the image at a higher temporal resolution. In addition, where the object has known static structures and known dynamic structures, a method such as that described in "Reduction of Field of View for Dynamic Imaging" by Hu and Parrish, published in Magnetic Resonance in Medicine, Vol. 31, pp. 691–694, 1994, may be used if the dynamic portion of the object is known to occupy a fraction of the full FOV. The difference between any time frame and a first time frame is used to produce a difference image. The difference image is insensitive to the static portion of the object. A √2 loss in SNR is expected due to the temporal resolution improvement if the dynamic region occupies half the full FOV. However, this method suffers an additional √2 reduction in SNR due to the subtraction operation. In addition, the authors report sensitivity to slow signal variations which cause artifacts. The method of the present invention delivers higher SNR and is less artifact prone than this prior art alternative.

SUMMARY OF THE INVENTION

The present invention is a method for updating an MR image using less than all the measurement cycles required for a complete scan to thereby increase the temporal resolution of the system. More particularly, the invention includes: acquiring NMR data and producing an image of the entire field of view; setting the image data to zero throughout a portion of its field of view to produce altered image data; inverse transforming the altered image data to yield synthetic raw data representing structures located outside the aforementioned portion of the field of view; acquiring new NMR data using less than all the measurement cycles required for a complete scan; subtracting the synthetic raw data from the new NMR data; reconstructing an image with the difference NMR data to produce an image of the aforementioned portion of the field of view. If desired, the inner portion image can be combined with the altered image data to produce a full field of view image.

The present invention takes advantage of the fact that in many dynamic MRI studies only a portion of the image is changing dramatically. Often this is the central portion of the image. The periphery of the image is relatively static and there is little need for a high temporal resolution to depict this surrounding region. Nevertheless, the signals from these surrounding stationary structures must be accounted for, or they will produce image artifacts in the central portion of the image. This is achieved by maintaining an estimate of the signals produced by surrounding structures and using this estimate to produce synthetic raw data for the peripheral regions of the image. In addition, this estimate is subtracted from newly acquired NMR data before it is used to reconstruct an image of the central portion of the final image. This enables less than a complete NMR data set to be acquired between updates of the central portion of the image, thus increasing the temporal resolution of this portion of the image.

A general object of the invention is to increase the temporal resolution of the system. For example, if the dynamic portion covers half of the full field of view, using the present method with a spin-warp measurement cycle, odd numbered phase encoding views may be obtained and used to update the image, followed by acquisition of the even numbered phase encoding views and another image update. Thus, in the time required to acquire a complete NMR image data set, the image is updated twice. This effectively doubles the temporal resolution.

DESCRIPTION OF THE PREFERRED EMBODIMENT

Figure 1:
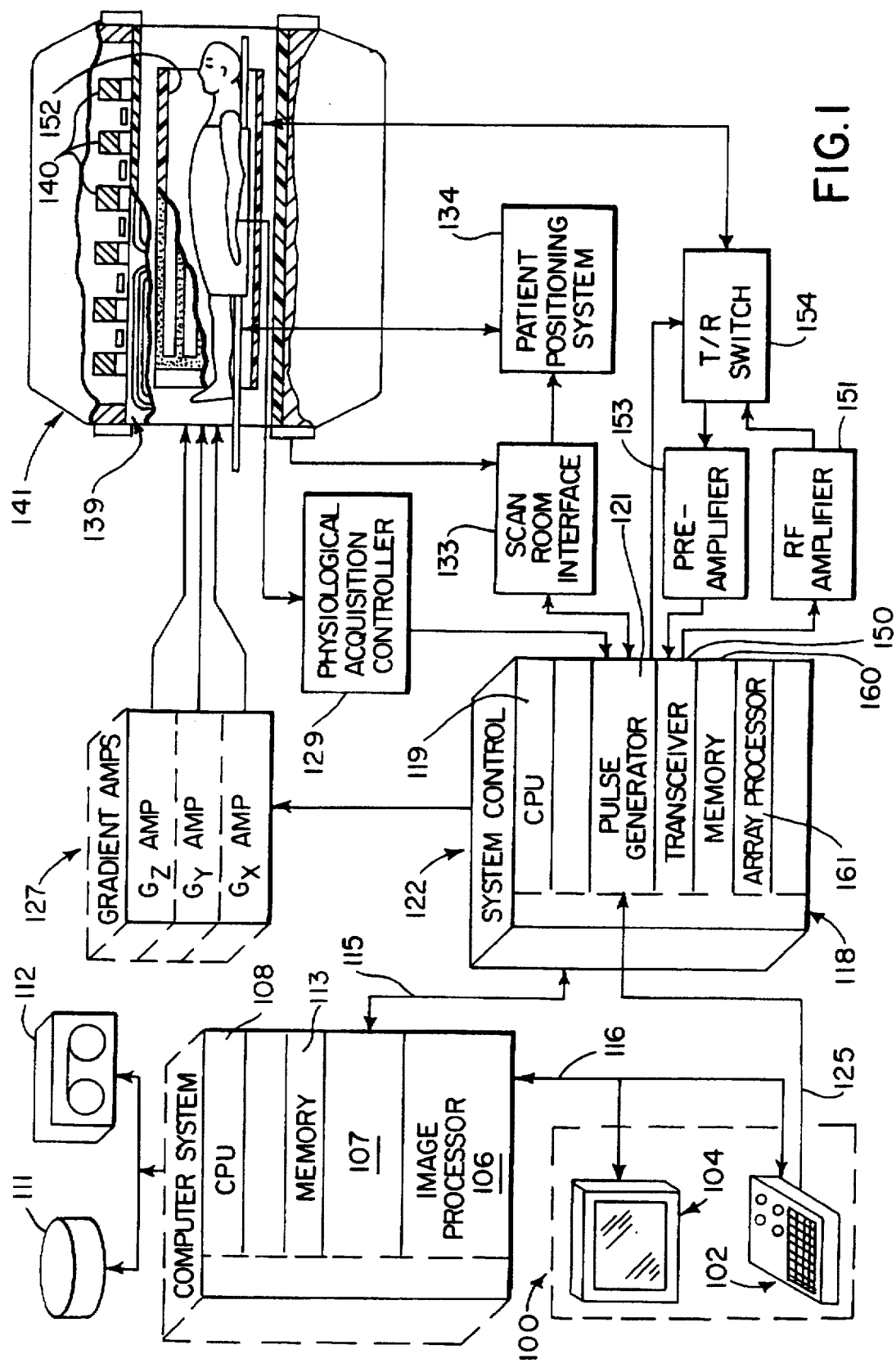
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$, and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

For a more detailed description of the transceiver 150, reference is made to U.S. Pat. Nos. 4,952,877 and 4,992,736 which are incorporated herein by reference.

Figure 2:
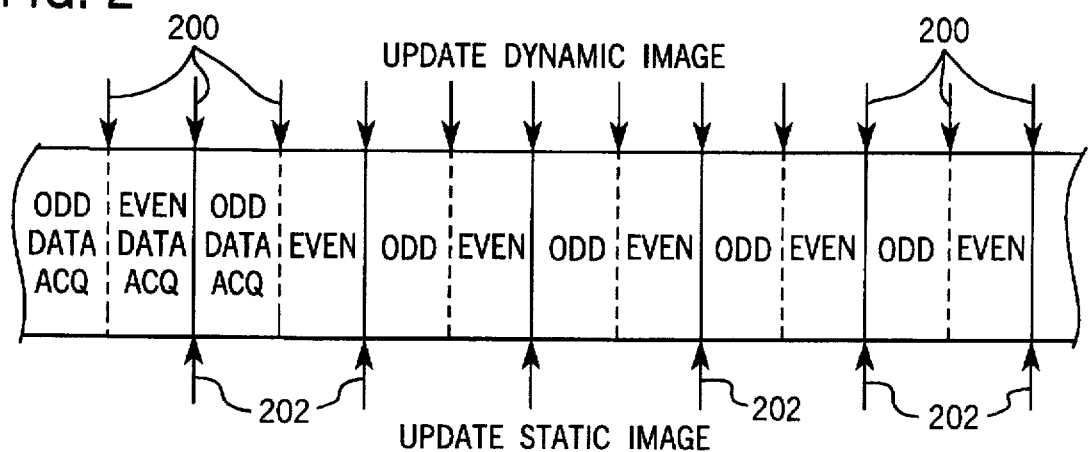
FIG. 2 is a schematic representation of the data acquisition sequence and image update frequency according to the present invention.

The present invention will be described in an application in which the central half of the field of view in the phase encoded direction is "dynamic" while the outer half is "static". It will be appreciated by those skilled in the art that other applications of the invention are possible. In the preferred embodiment of the invention a spin warp NMR pulse sequence such as that disclosed in U.S. Pat. No. 4,471,306 is employed to acquire NMR data during the scan of a subject. A total of 128 separate measurement cycles, each at a separate phase encoding value, are employed to acquire data from which a complete image of the entire field of view can be reconstructed. However, rather than acquiring the 128 "views" in monotonic order, (−63 through +64) all of the odd numbered views (i.e. −63, −61, −59, . . . , 61, 63) are acquired. As shown schematically in FIG. 2, as the scan progresses over time, therefore, NMR data is alternately acquired for the odd and even views for a series of progressively changing images. Using conventional image reconstruction methods, an updated image of the complete field of view is produced after the acquisition of a complete set of both odd and even views. The temporal resolution is, therefore, the time required to acquire both the odd and the even views.

The present invention doubles the temporal resolution by providing two updated images during the same time period. More specifically, an updated image is produced after the acquisition of all the odd numbered views, and another updated image is produced after the acquisition of all the even numbered views. This is accomplished by performing two separate procedures during the scanning operation: updating a dynamic image after each odd and each even data acquisition, as indicated at arrows 200; and updating a static image after each complete data set (i.e. both odd and even views) is acquired, as indicated by arrows 202. These update procedures are carried out by the array processor 161 (FIG. 1) in accordance with steps illustrated in FIGS. 3 and 4.

Figure 3:
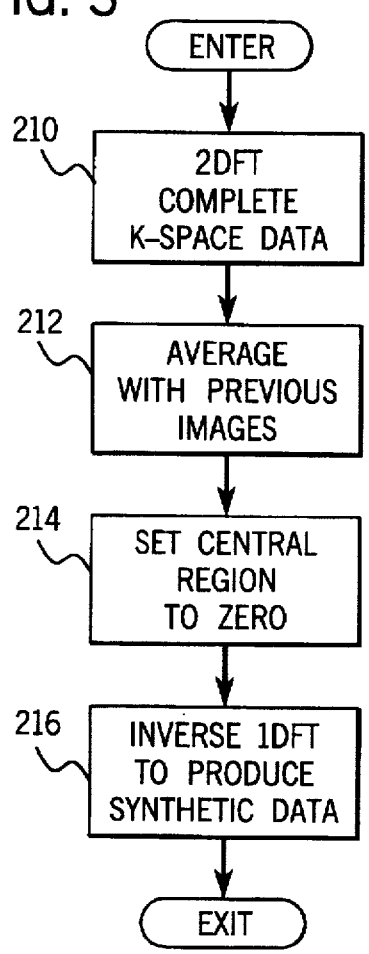
FIG. 3 is a flow chart which depicts how the MRI system of FIG. 1 updates the static image.

Referring particularly to FIG. 3, after each complete k-space data set of 128 separately phase encoded views is acquired, an image is reconstructed therefrom in the usual manner by performing a two-dimensional Fourier transformation ("2DFT") as indicated by process block 210. This "current" image is averaged with previously acquired images to produce a "static" image as indicated at process block 212.

The number of previously acquired complete images included in the average controls the temporal resolution of the "static" region. If none or very few are used, the system will be capable of handling a fair amount of motion in the static region but it may be sensitive to noise and system instabilities. A longer averaging period reduces these effects. The averaging period should therefore be selected to be comparable to the time over which the outer portion is fairly static—generally a few seconds.

The central region of the updated static image is then set to zero, as indicated by process block 214, and it is inverse Fourier transformed along the phase encoding axis, as indicated at process block 216, to produce synthetic data. The central region that is set to zero encompasses one-half of the image field of view and it should encompass any structures that are changing rapidly during the scan. Structures outside this central region should be either stationary or slowly changing since the static image is updated at a relatively low temporal resolution.

Figure 4:
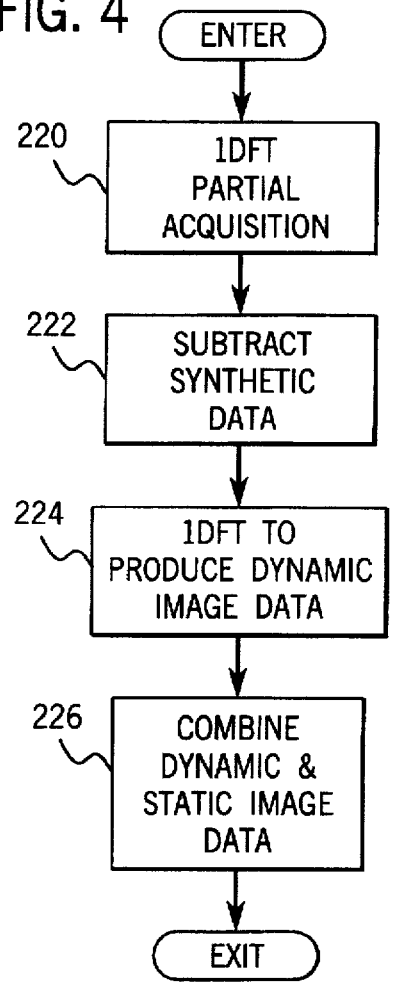
FIG. 4 is a flow chart which depicts how the MRI system of FIG. 1 updates the dynamic image and combines it with static image.

Referring particularly to FIG. 4, after each partial data acquisition of either the odd or even phase encoding views, the array processor 161 performs a one dimensional Fourier transformation on the acquired partial data set as indicated by process block 220. This transformation is performed along the readout gradient axis. (x axis in the preferred embodiment). A partial data set of only odd or only even views contains the information necessary to produce a high spatial resolution image for an object covering half of the full field of view (e.g. of the dynamic portion). Presence of signal producing regions outside this region will lead to spatial aliasing artifacts, as is well known in this field. It is a teaching of the present invention that these artifacts can be suppressed by subtracting from the transformed odd or even views the corresponding synthetic data, as indicated at process block 222. In other words, the odd views of the synthetic data are subtracted from the corresponding transformed odd views of the most recently acquired data, or the even views of the synthetic data are subtracted from the corresponding transformed even views of the most recently acquired data. As indicated by process block 224, this difference data is then transformed along the phase encoding gradient axis (y axis in the preferred embodiment) to produce an image in real space of the central portion of the field of view.

It may be desired to produce images that contain both the static and the dynamic portion of the FOV. This can be produced by inserting the dynamic inner FOV images into the estimated average image for the outer portions. Therefore, as indicated at process block 226, the "dynamic" image of the central region is combined with the "static" image of the surrounding regions to produce an updated full field of view image. This updated image is output to the computer system 107 as described above for display and further image processing.

It should be apparent to those skilled in the art that numerous variations from the preferred embodiment are possible without departing from the spirit of the invention. In the preferred embodiment the outer, static image was obtained by a simple average of the preceding frames of acquired data. An exponential average can also be used, and the static image can also be produced using an extrapolation method. For example, for each phase encoding value, the proceeding data acquisitions can be used to form a linear fit, and the fit used to predict the static image data for the frame of interest.

The described implementation assumed that the dynamic portion of the object was in the center of the FOV, with the outer portion of the FOV being static. It can also be employed if the dynamic portion is not in the center. This can be accomplished by premultiplying all the measured data by appropriate linearly varying (in k-space) phase shifts. As is known in the art, linear phase shifts in k-space produce spatial shifts in image space. The phase shifts are selected so as to translate the dynamic portion of the object into the center of the shifted FOV.

In the examples described thus far, the dynamic portion covered half the field of view and this knowledge was used to improve the temporal resolution by a factor of 2. In general, if the dynamic portion is a fraction (1/n) of the field of view the temporal resolution can be improved by a factor of n.

The invention can also be applied to techniques other than spin warp imaging. One MR imaging strategy collects Fourier transform data as spirals in Fourier transform space (k-space). Often, multiple interleaved spiral trajectories are employed to obtain the necessary spatial resolution and FOV. The interleaved trajectories are generally obtained by rotating the initial trajectory in k-space by (360/L) degrees, where L is the number of interleaves. The K-space distance between interleaved trajectories, and therefore the number L, determines the field of view. The invention can be used to improve the temporal resolution in dynamic studies with interleaved spiral trajectories in a manner analogous to the way it is used in Spin Warp imaging. Similarly, the invention can also be used with interleaved Echo Planar Imaging (EPI).

The key aspect of all these applications is as follows. For any time frame, partial k-space sampling is used which is not sufficient to portray the full FOV. However, the sample in one time frame can be interleaved with those in other time frames so that, together, they can adequately portray the full FOV. Full field of view images are processed to yield estimated raw NMR data for the static portions of the full field of view. These are subtracted from acquired partial k-space data to produce a high quality image of the dynamic portion of the field of view.

Thus, while the invention has been described with reference to specific embodiments, the description is illustrative of the invention and is not to be construed as limiting the invention. Various applications and modifications may occur to those skilled in the art without departing from the true spirit and scope of the invention as defined by the appended claims.

We claim:

1. A method for producing a series of images with an MRI system, the steps comprising:
    a) acquiring NMR data comprised of a full set of measurements from which an image having a selected field of view may be reconstructed;
    b) transforming the acquired NMR data to reconstruct a static image which forms part of the selected field of view;
    c) producing synthetic raw data from the static image which indicates structures located in the substantially static portion of the field of view;
    d) acquiring new NMR data using less than a full set of measurements;
    e) subtracting the synthetic raw data from the new NMR data to produce corrected new NMR data; and
    f) transforming the corrected new NMR data to reconstruct a dynamic image which forms another part of the field of view.

2. The method as recited in claim 1 which includes the further step of:
    g) combining the static image and the dynamic image to produce an updated image of the entire field of view.

3. The method as recited in claim 2 in which steps a) through g) are repeated in a series of scans to produce a corresponding series of updated images.

4. The method as recited in claim 3 in which the new NMR data acquired in step d) is substantially one-half the full set of measurements and the new NMR data alternates between a first one-half of the full set of measurements and a second one-half of the full set of measurements during said series of scans.

5. The method as recited in claim 4 in which the transformation in step b) is a Fourier transformation and each measurement in the full set of measurements is a separate phase encoding view.

6. The method as recited in claim 5 in which the first one-half of the full set of measurements is the odd numbered phase encoding views and the second one-half of the full set of measurements is the even numbered phase encoding views.

7. The method as recited in claim 3 in which steps b) and c) are periodically repeated using new NMR data acquired in step d).

8. The method as recited in claim 1 in which step b) includes Fourier transforming the acquired NMR data in two dimensions to produce an image of the entire field of view and setting to zero the dynamic portion of the image.

9. The method as recited in claim 8 in which step c) includes inverse Fourier transforming the static image along one dimension.

10. The method as recited in claim 9 in which the new NMR data acquired in step d) is Fourier transformed along one dimension before the synthetic raw data is subtracted in step e).

11. The method as recited in claim 1 in which the data acquired in steps a) and d) are shifted in phase to translate the dynamic portion of the image into the center of a shifted field of view.

* * * * *